US005591996A

United States Patent [19]
Haigh et al.

[11] Patent Number: 5,591,996
[45] Date of Patent: Jan. 7, 1997

[54] RECIRCULATING CHARGE TRANSFER MAGNETIC FIELD SENSOR

[75] Inventors: Geoffrey T. Haigh, Boxford; Scott C. Munroe, Carlisle, both of Mass.

[73] Assignee: Analog Devices, Inc., Norwood, Mass.

[21] Appl. No.: 409,809

[22] Filed: Mar. 24, 1995

[51] Int. Cl.$^6$ .................. H01L 27/148; H01L 29/768
[52] U.S. Cl. .................. 257/238; 257/214; 257/223; 257/229; 257/422; 348/313; 348/318
[58] Field of Search .................. 257/214, 222, 257/223, 225, 229, 238, 422; 348/313, 318

[56] References Cited

U.S. PATENT DOCUMENTS

| | | |
|---|---|---|
| 3,906,359 | 9/1975 | Blaha et al. . |
| 4,163,986 | 8/1979 | Vinal . |
| 4,270,144 | 5/1981 | Hartman et al. . |
| 4,488,164 | 12/1984 | Kazarinov et al. . |
| 4,677,380 | 6/1987 | Popovic et al. .................. 324/252 |
| 4,801,991 | 1/1989 | Hisa . |
| 4,855,800 | 8/1989 | Esquivel et al. . |
| 5,083,174 | 1/1992 | Kub . |
| 5,194,750 | 3/1993 | Popovic . |
| 5,196,821 | 3/1993 | Partin et al. . |

FOREIGN PATENT DOCUMENTS

| | | |
|---|---|---|
| 0063209 | 10/1982 | European Pat. Off. . |
| 96218 | 5/1983 | European Pat. Off. . |
| 0129707 | 1/1985 | European Pat. Off. . |
| 1473430 | 5/1977 | United Kingdom . |
| 2143085 | 1/1985 | United Kingdom . |
| 2153145 | 8/1985 | United Kingdom . |
| WO80/02618 | 11/1980 | WIPO . |

OTHER PUBLICATIONS

Baltes, Henry P. and Radivoje S. Popović, "Integrated Semiconductor Magnetic Field Sensors", *Proceedings of the IEEE*, vol. 74, No. 8, Aug. 1986, pp. 1107–1132.

Hölzlein, K. and J. Larik, "Silicon Magnetic Field Sensor with Frequency Output", *Sensors and Actuators*, 1991, pp. 349–355.

Hoople, Christopher R. and J. Peter Krusius, "Characteristics of Submicrometer Gaps in Buried–Channel CCD Structures", *IEEE Transactions on Electron Devices*, vol. 38, No. 5, May 1991, pp. 1175–1181.

Huang, Rei–Min, Fon–Shan Yeh and Ruey–Shing Huang, "Double–Diffusion Differential–Amplification Magnetic Sensor", *IEEE Transactions on Electron Devices*, vol. ED–31, No. 7, Jul. 1984, pp. 1001–1004.

Huiser, A. M. J. and H. P. Baltes, "Numerical Modeling of Vertical Hall–Effect Devices", *IEEE Electron Device Letters*, vol. EDL–5, No. 11, Nov. 1984, pp. 482–484.

(List continued on next page.)

Primary Examiner—Ngân V. Ngô
Attorney, Agent, or Firm—Samuels, Gauthier, Stevens & Reppert

[57] ABSTRACT

A device for producing an output voltage which is proportional to an applied magnetic field. The device includes a plurality charge injection regions, a corresponding plurality of charge exit regions, and a charge transfer region. The charge transfer region includes gate electrodes which serve to propagate at least one isolated charge packet across the charge transfer region in a predetermined direction from the charge input region to the charge output region. The charge packet is subject to the applied magnetic field which is perpendicular to the charge transfer region so as to induce a resultant potential that is orthogonal to both the applied magnetic field and the predetermined direction. Furthermore, the resultant potential effects a lateral redistribution of charge carriers in the packet. A recirculation configuration allows for a recycling of the packet from the output region back to the input region in order to accommodate a continuation of the redistribution of charge carriers. Sense contacts are provided with the recirculation configuration for sensing the resultant potential as the output voltage.

38 Claims, 7 Drawing Sheets

OTHER PUBLICATIONS

Hynecek, Jaroslav, "Virtual Phase Technology: A New Approach to Fabrication of Large–Area CCD's", *IEEE Transactions on Electron Devices*, vol. ED–28, No. 5, May 1981, pp. 483–489.

Kapoor, Vikram J., "Charge–Coupled Devices with Submicron Gaps", *IEEE Electron Device Letters*, vol. EDL–2, No. 4, Apr. 1981, pp. 92–94.

Kawahito, S., S. O. Choi, M. Ishida and T. Nakamura, "Micromachined Hall Elements for Two–Dimensional Magnetic–Field Sensing", *Sensors and Actuators*, 1994, pp. 141–146.

Kawahito, S., Y. Sasaki, M. Ashiki and T. Nakamura, "Micromachined Solenoids for Highly Sensitive Magnetic Sensors", *Transducers*, 1991, pp. 1077–1080.

Kawahito, S., Y, Sasaki, H. Sato, T. Nakamura and Y. Tadokoro, "A Fluxgate Magnetic Sensor with Micro–Solenoids and Electroplated Permalloy Cores", *Sensors and Actuators*, 1994, pp. 128–134.

Kemmer, J. and G. Lutz, "New Detector Concepts", *Nuclear Instruments and Methods in Physics Research*, 1987, pp. 365–377.

Kordic, S., "Integrated 3–D Magnetic Sensor Based on an N–P–N Transistor", *IEEE Electron Device Letters*, vol. EDL–7, No. 3, Mar. 1986, pp. 196–198.

Kordic, Srdjan and Peter J. A. Munter, "Three–Dimensional Magnetic–Field Sensors", *IEEE Transactions on Electron Devices*, vol. 35, No. 6, Jun. 1988, pp. 771–779.

Maas, H. G. R. and J. A. Appels, "Pablo A Versatile VLSI Technology", *Phillips Journal of Research*, vol. 39, No. 3, 1984, pp. 103–108.

Maenaka, K., T. Ohgusu, M. Ishida and T. Nakamura, "Noval Vertical Hall Cells in Standard Bipolar Technology", *Electronics Letters*, vol. 23, No. 21, Oct. 8, 1987, pp. 1104–1105.

Milnes, A. G., "Charge–Transfer Devices", *Semiconductor Devices and Integrated Electronics*, Chapter 10, (Van Nostrand Reinhold Company), pp. 590–599.

Munter, P. J. A., "A Low–Offset Spinning–Current Hall Plate", *Sensors and Actuators*, 1990, pp. 743–746.

Munter, P. J. A., "Electronic Circuitry for a Smart Spinning–Current Hall Plate with Low Offset", *Sensors and Actuators*, 1991, pp. 747–751.

Nakamura, T. and K. Maenaka, "Integrated Magnetic Sensors", *Sensors and Actuators*, 1990, pp. 762–769.

Nathan, Arokia, Andre J. Huiser and Henry P. Baltes, "Two–Dimensional Numerical Modeling of Magnetic–Field Sensors in CMOS Technology", *IEEE Transactions on Electron Devices*, vol. ED–32, No. 7, Jul. 1985, pp. 1212–1219.

Ohba, Shinya, Masakazu Aoki, Masaaki Nakai, Shigeru Shimada, Hyotake Uchiumi, Minoru Fujita and Masaharu Kubo, "A 1024–Element Linear CCD Photo Sensor with Unique Photodiode Structure", *IEEE Transactions on Electron Devices*, vol. ED–27, No. 9, Sep. 1980, pp. 1804–1808.

Ong, DeWitt, "An All–Implanted CCD/CMOS Process", *IEEE Transactions on Electron Devices, vol. ED–28, No. 1, Jan. 1981, pp. 6–12*.

Paranjape, M. and Lj. Ristic, "Micromachined Vertical Hall Magnetic Field Sensor in Standard Complementary Metal Oxide Semiconductor Technology", *Appl. Phys. Lett.*, vol. 60, No. 25, Jun. 22, 1992, pp. 3188–3190.

Pinotti, E., H. Bräuninger, N. Findeis, H. Gorke, D. Hauff, P. Holl, J. Kemmer, P. Lechner, G. Lutz, W. Kink, N. Meidinger, G. Metzner, P. Predehl, C. Reppin, L. Strüder, J. Trümper, C. v. Zanthier, E. Kendziorra, R. Staubert, V. Radeka, P. Rehak, G. Bertuccio, E. Gatti, A. Longoni, A. Pullia and M. Sampietro, "the pn–CCD On–Chip Electronics", *Nuclear Instruments & Methods in Physics Research*, 1993, pp. 85–91.

Popovic, R. S., "The Vertical Hall–Effect Device", *IEEE Electron Device Letters*, vol. EDL–5, No. 9, Sep. 1984, pp. 357–358.

Popovic, R. S. and H. P. Baltes, "Enhancement of Sensitivity of Later Magnetotransistors", *Rapport de la réunion d'automne de la Société Suisse de Physique*, vol. 55, 1982, pp. 599–603.

Popovic, Radivoje, Henry P. Baltes and Felix Rudolf, "An Integrated Silicon Magnetic Field Sensor Using the Magnetodiode Principle", *IEEE Transactions on Electron Devices*, vol. ED–31, No. 3, Mar. 1984, pp. 286–291.

Popovic, Radivoje and Rolf Widmer, "Magnetotransistor in CMOS Technolgy", *IEEE Transactions on Electron Devices*, vol. ED–33, No. 9, Sep. 1986, pp. 1334–1340.

Randhawa, Gian S., "Monolithic Integrated Hall Devices in Silicon Circuits", *Microelectronics Journal*, vol. 12, No. 6, 1981, pp. 24–29.

Ristic, L. J., T. Q. Truong, M. Doan, D. Mladenovic and H. P. Baltes, "Influence of Surface Effects on the Sensitivity of Magnetic–Field Sensors", *Can. J. Phys.*, vol. 67, 1989, pp. 207–211.

"Sensors: Improved Hall Devices Find New Uses", *Electronics Week*, Apr. 29, 1985, pp. 59–61.

Shibasaki, I., Y. Kanayama, K. Nagase, T. Ito, F. Ichimori, T. Yoshida and K. Harada, "High Sensitive Thin Film InAs Hall Element By MBE", *Transducers*, 1991, pp. 1069–1072.

Strüder, L., P. Holl, G. Lutz and J. Kemmer, "Device Modeling of Fully Depletable CCDs", *Nuclear Instruments and Methods in Physics Research*, 1987, pp. 386–392.

Theuwissen, A. J. P. and C. H. L Weijtens, "The Accordian Imager, a New Solid–State Image Sensor", *Philips Technical Review*, vol. 43, No. 1/2, Dec. 1986, pp. 1–8.

Turvey, Keith and James J. Dignan, "Optimum Rectangular Geometry for Hall Effect Devices and Their Application in Determining Properties of Electrons in Silicon", *Am. J. Phys.*, vol. 60, No. 7, Jul. 1992, pp. 608–615.

Warmerdam, Leo and Hans Wallinga, "A Buried–Channel Charge–Coupled Device with Non–Overlapping Gate Structure for a CMOS/BCCD Process", *Semicond. Sci. Technol.*, vol. 7, 1992, pp. 658–663.

Wolsheimer, Evert A. and Marcus Kleefstra, "Experimental Results on Junction Charge–Coupled Devices", *IEEE Transactions on Electron Devices*, vol. ED–29, No. 12, Dec. 1982, pp. 1930–1936.

Zieren, Victor and Bart P. M. Duyndam, "Magnetic–Field–Sensitive Multicollector N–P–N Transistors", *IEEE Transactions on Electron Devices*, vol. ED–29, No. 1, Jan. 1982, pp. 83–90.

RECIRCULATING CHARGE TRANSFER MAGNETIC FIELD SENSOR

BACKGROUND OF THE INVENTION

The present invention relates to a recirculating charge transfer magnetic field sensor.

Conventional semiconductor magnetic field sensors typically operate as a Hall cell. In the operation of Hall-effect components, an electrical potential difference is known to result from charge-carrier drift in a magnetic field. As shown in FIG. 1, the Hall cell 10 includes a resistive sheet 12 or substrate, an input conductive contact 14, an output conductive contact 16, and sense contacts 18. The cell 10 operates to measure the displacement of the carriers in the resistive sheet in response to an applied magnetic field, Conventional Hall cells are microscopic plates, for example, the thickness being t=10 µm, the length l=200 µm and the width w=100 µm. A bias voltage V is applied to the plate via two current contacts C1 and C2, The bias voltage creates an electric field $E_e$ and forces a current I. If the plate is exposed to a perpendicular magnetic induction B, the Hall electric field $E_H$ occurs in the plate. The Hall electric field gives rise to the appearance of the Hall voltage $V_H$ between the two sense contacts S1 and S2.

Charge transport of this type depends on the properties of the semiconductor used and on the environmental conditions. Any change in the semiconductor properties or the environment causes a change in the output signal of the Hall-effect component. Hall-effect components are particularly sensitive to surface effects, encapsulation stress, light, temperature, changes in the material doping density gradient, etc. Therefore, to obtain high-precision magnetic field sensors, the Hall-effect component must be made of a special semiconductor material, including a special encapsulation, and by means of non-standard process steps. Furthermore, external temperature variations must be compensated for. For this reason, it is difficult to integrate a good Hall-effect component into a signal processing circuit.

In addition, errors in measurement occur due to the inability to create precise positioning of charge contacts. Positioning errors of the contacts in the order of micrometers give rise to millivolt output offsets. Also, the ratio of sensitivity to accuracy in such devices remains constant with device geometric changes.

More recently, charge-coupled device (CCD) magnetic field sensors have been developed to improve the precision for measuring magnetic fields. Examples of such devices are described in U.S. Pat. No. 3,906,359 and U.S. Pat. No. 5,194,750, both incorporated herein by reference. In these prior art CCD magnetic field sensors, the measurement arises from a lateral redistribution of carriers within a moving charge packet. The redistribution is caused by the well known Lorentz force acting upon the carriers, which is proportional to their velocity, charge, and the magnitude of the magnetic field. In the devices described in the '750 patent, the potential difference between the ends of the packet (which arises from that redistribution of carriers) is sensed by means of a pair of contacts, centrally located with respect to a series of gates which propagate the packet. In the devices described in the '359 patent, the measure of the magnetic field is given by the difference in the number of carriers arriving at two contacts situated at the end of the array of propagation gates and at the ends of the charge packet, i.e. by the difference in the two currents observed to exit the two contacts.

Unfortunately, the prior art devices lack high measuring sensitivity and accuracy due to geometric limitations and the physics of semiconductor materials. The ultimate sensitivity of such devices is proportional to the width of the propagating charge packet and its velocity. Increasing the width of the packet in turn increases (as the square of the increase in width) the time required for the redistribution to fully occur. Accordingly, for a device of a given length, increasing the velocity (decreasing the time for the packet to traverse the device) or increasing its width will decrease the percentage of full redistribution that occurs yielding no net increase in sensitivity. The redistribution time constant, in fact, involves the carrier mobility which is strongly a function of temperature. The sensitivity that is achieved for such devices, will thus be also affected by temperature and for realistically sized devices, fall far short of the expected sensitivity. In these prior art devices, the carrier mobility temperature coefficient will also affect proportionately, the current observed to exit the contacts and hence their difference. Since that difference is the measurement output, it will have a commensurate additional error.

It is therefore an object of the present invention to provide a CCD magnetic field sensor which maximizes sensitivity and precision, while maintaining realistic limits on device dimensions.

It is a further object of the present invention to provide a CCD magnetic field sensor which operates to ensure that the output potential settles to a value indicated by the Faraday equation by accommodating full lateral redistribution of carriers within propagating charge packets.

It is another object of the present invention to provide a CCD magnetic field sensor which utilizes a recirculation technique to accommodate full lateral redistribution of carriers in the charge packets.

SUMMARY OF THE INVENTION

The present invention provides a device for producing an output voltage which is proportional to an applied magnetic field. The device includes a plurality of charge injection regions and a matching plurality of charge exit regions, a charge transfer region, and recirculation means for conducting the portion of the charge packet appearing at each exit region back to the corresponding charge injection region. The transfer region includes gate electrodes which serve to propagate at least one isolated charge packet across the charge transfer region in a predetermined direction from the charge injection regions to the charge exit regions.

The moving charge packet is subject to the applied magnetic field which is perpendicular to the charge transfer region so as to induce a resultant potential that is orthogonal to both the applied magnetic field and the predetermined direction. Furthermore, the resultant potential effects a redistribution of charge carriers in the packet. The resultant potential arises from the lateral redistribution of the charge carriers within the packet. The redistribution is, in turn, due to the well known Lorentz force which the carriers experience, and which is proportional to the product of their velocity and the magnitude of the orthogonal magnetic field. The magnitude of the induced potential is given by Faraday's law of induction, E=VWB, where E is the potential in volts, V is the velocity of the packet in meters per second, B is the orthogonal component of the magnetic field in Tesla (1 Tesla=$10^4$ Gauss), and W is the width of the packet.

As the packet is made wider and/or to move faster, the induced potential increases for a given magnetic field. The device in accordance with the present invention can thus be made more or less sensitive by controlling its geometry and drive velocity. As the width and/or velocity is increased, an increasingly smaller percentage of the final redistribution will occur in a single traverse of the transfer region. In fact, for devices on the order of 1 mm in width, the charge redistribution is barely started by the time the packet has fully traversed the transfer region.

The recirculation configuration of the present invention allows the charge packet to repeatedly traverse the transfer region, and thus to settle to its final value of redistribution. The recirculation conductors at the extremes of the packet serve as a convenient means of sensing the potential developed by the charge redistribution.

DETAILED DESCRIPTION OF THE ILLUSTRATED EMBODIMENTS

Figure 1:
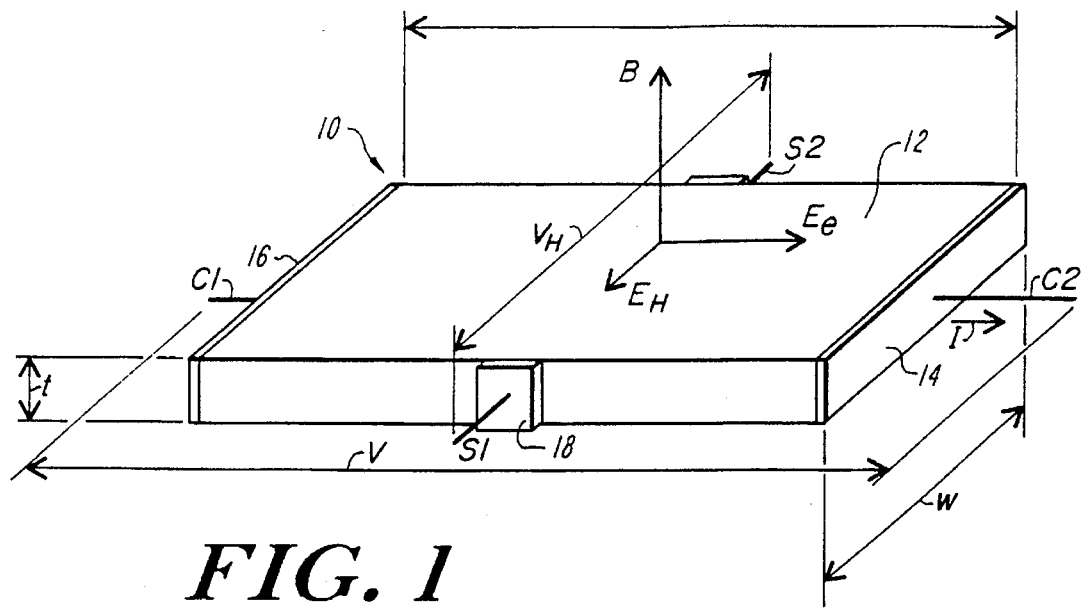
FIG. 1 shows a perspective view of a block diagram of a conventional Hall cell.
Figure 2:
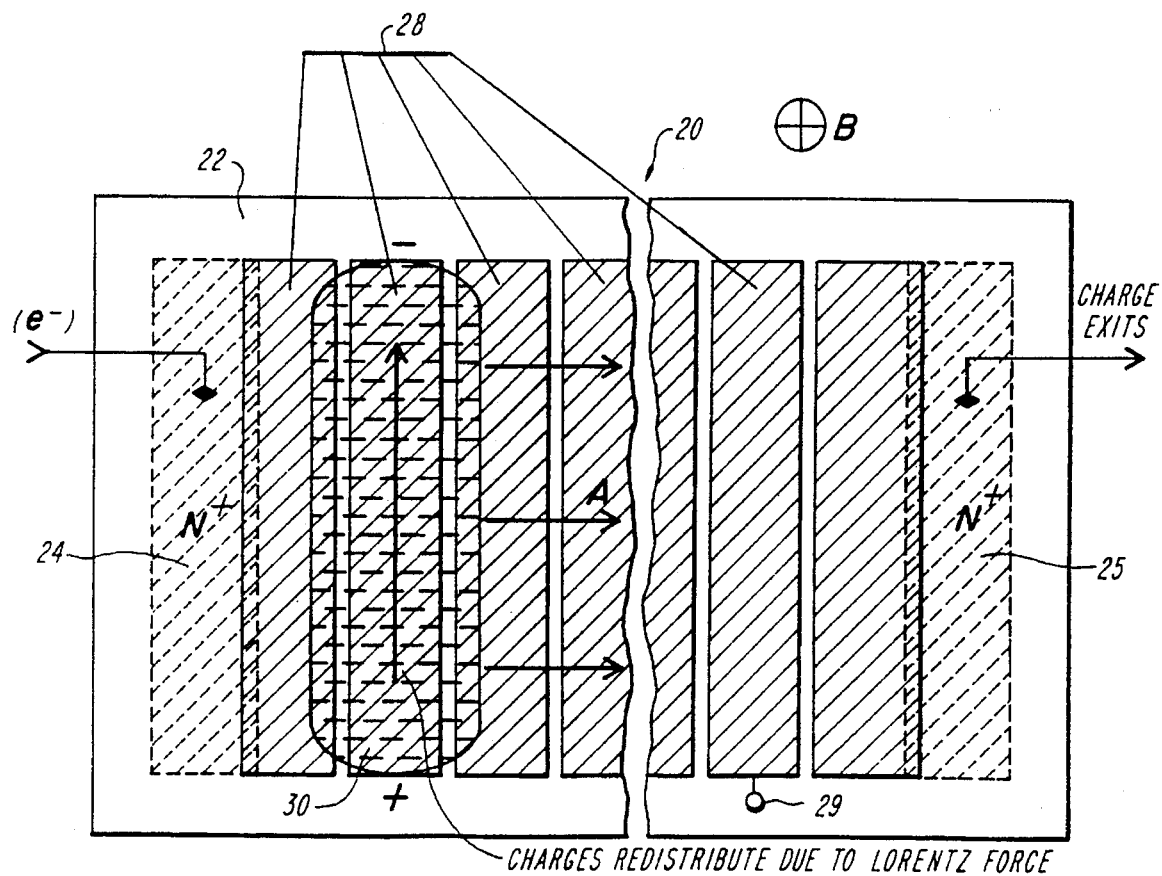
FIG. 2 shows a plan view of a block diagram of an exemplary charge-coupled device in which the carriers in moving charge packets redistribute laterally due to an applied magnetic field.
Figure 3:
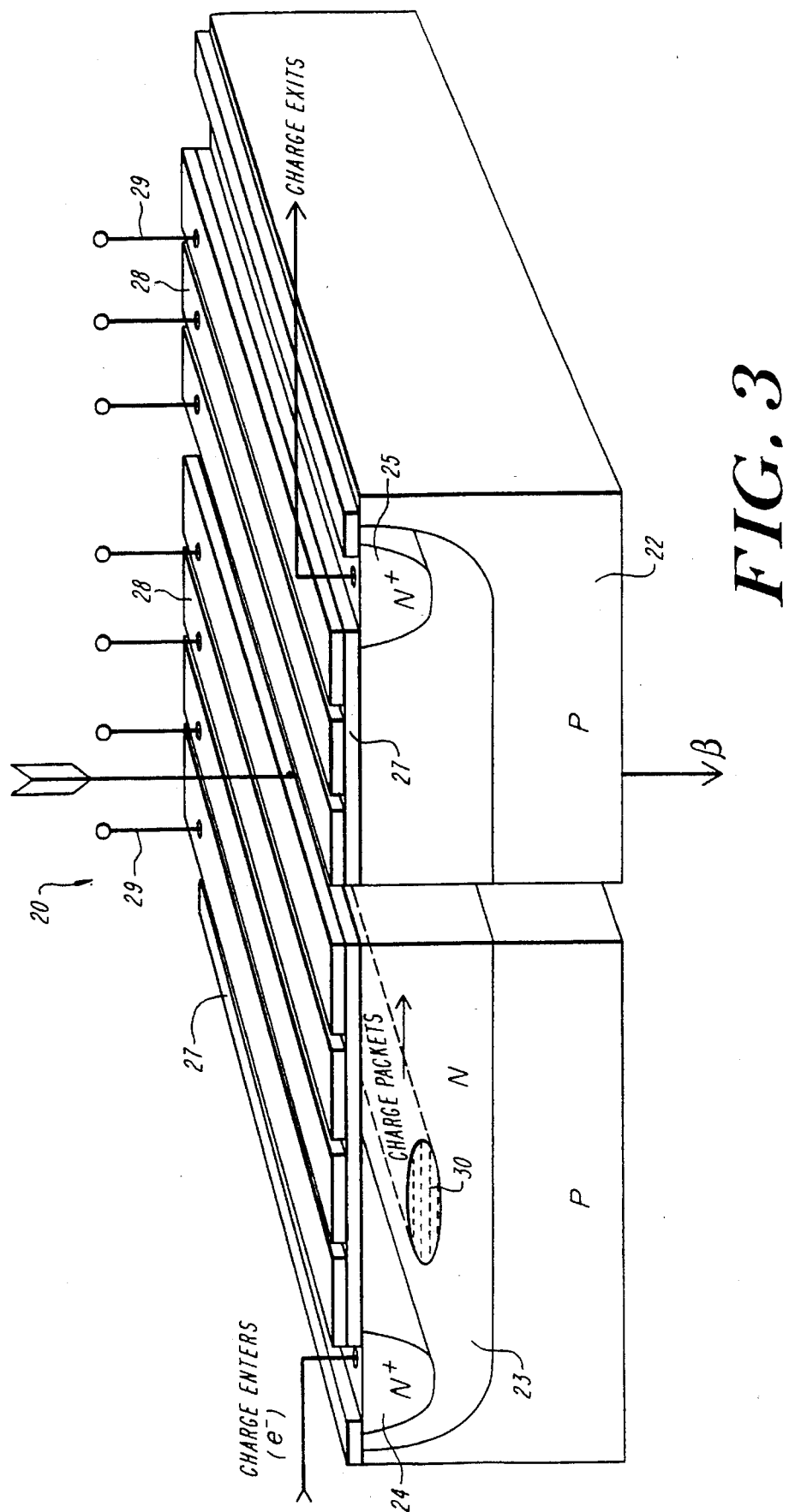
FIG. 3 shows a partial cut-away perspective view of the block diagram of the magnetic sensor of FIG. 2.

Referring now to FIGS. 2 and 3, an exemplary embodiment of a charge transfer magnetic field sensor 20 in accordance with the present invention is shown as being configured as a charge-coupled device. It will be appreciated by those of skill in the art that alternative embodiments of the sensor can be configured as any charge transfer device, for example a surface channel CCD or bucket brigade device. The exemplary sensor 20 includes a p-type semiconductor region 22, an n-type well 23, an $n^+$ charge injection region 24, a corresponding $n^+$ charge exit region 25, and a linear array of gate electrodes 28. Accordingly, the magnetic field sensor is illustrated as being constructed as, but not limited to being, a buried channel charge transfer device. Each gate electrode 28 is provided with a respective gate connection 29. During the operation of the magnetic field sensor 20, the electrical potential appearing at the charge exit region 25 can be utilized to determine the magnetic field B, as will be described hereinafter.

The gate electrodes are preferably made of thin, highly doped polycrystalline silicon (poly-si) layers and are preferably arranged parallel to each other at maximum inter-gate spacings of approximately 0.3 μm. Each is approximately 5 to 12 μm long. An insulating layer 27 is preferably made of $SiO_2$. The insulating layer is provided with passages for the sense contacts and the electrical connections for the charge injection and exit regions. It will be appreciated that the device can be configured as a junction CCD which includes $n^+/p^+$ diffused gates and junction isolation.

The charge injection and exit regions as previously described are each made of a diffusion of semiconductor material of a conductivity type, for example $n^+$, which is heavily doped with impurity atoms. Each is located in the n-type well which is at the outer surface of the p-type substrate semiconductor region. As shown in FIGS. 2 and 3, the charge injection region 24 and the charge exit region 25 are placed in parallel to the gate electrodes 28, and at the ends of the row of electrodes proximate to the two outer gate electrodes. A magnetic field to be measured, having a magnetic field B, is oriented orthogonally to the plane of the electrodes 28.

The gate electrodes of at least one charge-coupled device are placed on the insulating layer of all magnetic field sensors according to the present invention. These gate electrodes form a line of elongated rectangular bands extending in the direction A. The gate electrodes are arranged in parallel and constitute a straight row of electrodes, which row extends at a right angle to their longitudinal axes in the direction of A.

Figure 4:
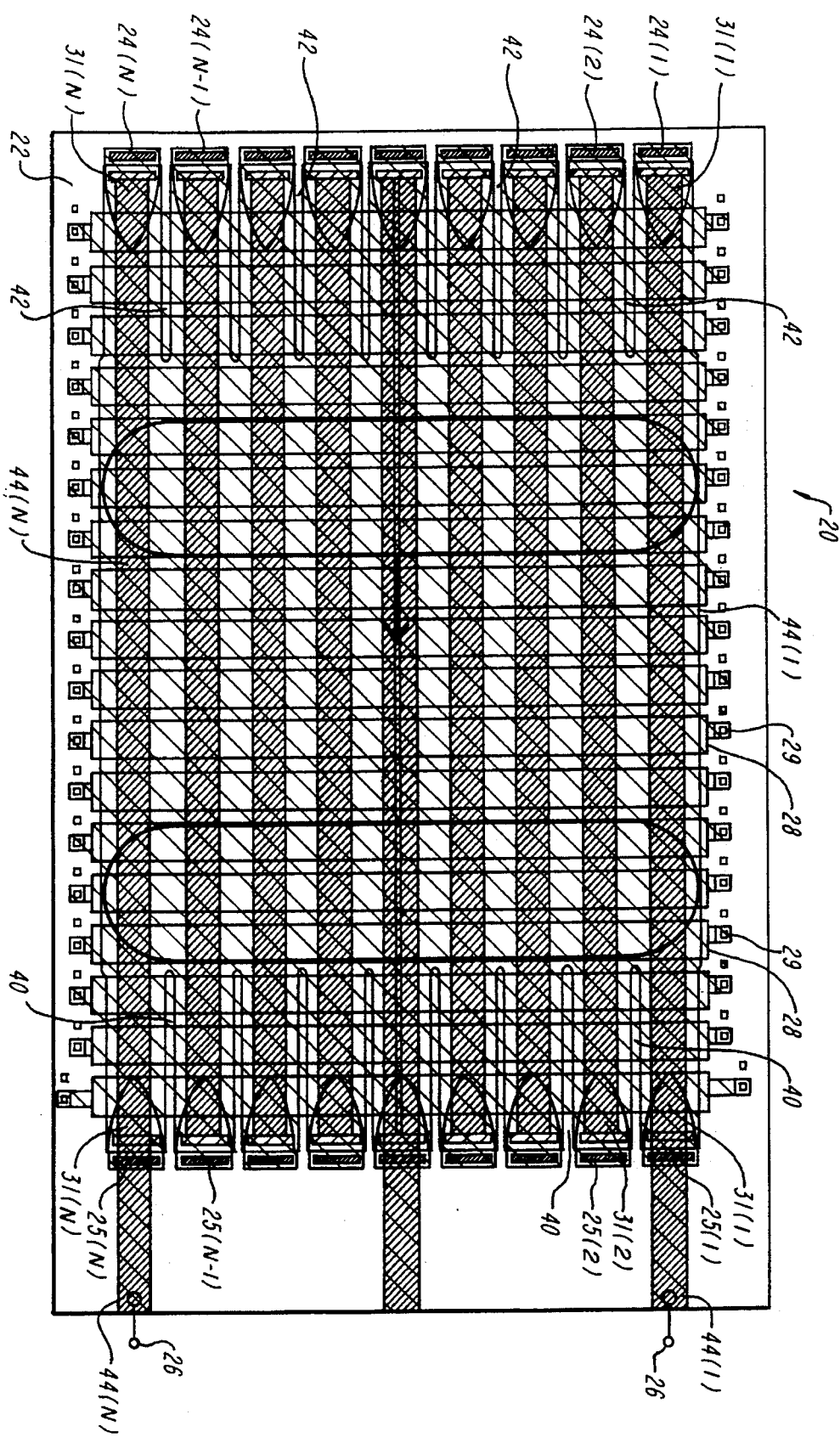
FIG. 4 shows a plan view of a block diagram of a charge transfer magnetic field sensor with a recirculation configuration in accordance with the present invention.
Figure 5:
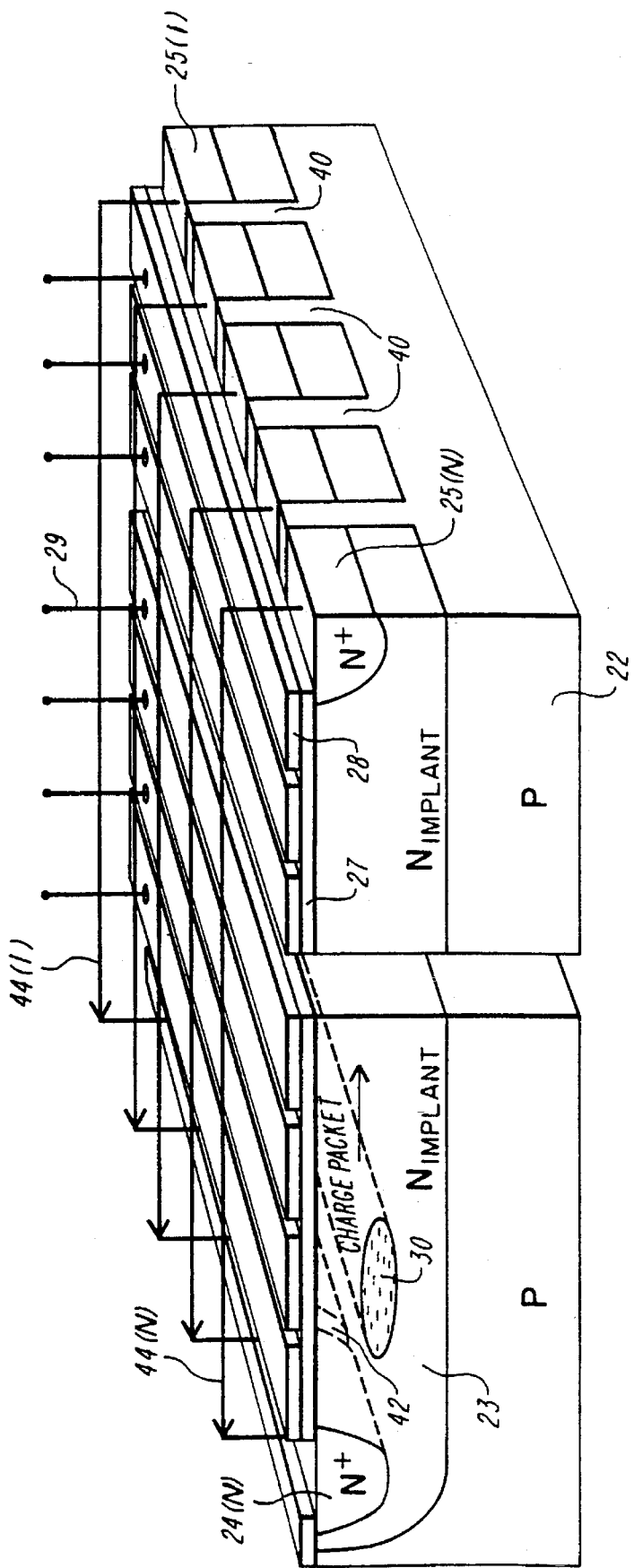
FIG. 5 shows a partial cut-away perspective view of the block diagram of the magnetic sensor of FIG. 4.

With reference now to FIGS. 4 and 5, an exemplary embodiment of the charge transfer magnetic sensor 20 with a recirculation configuration in accordance with the present invention is shown. The sensor 20 is constructed with a plurality of distinct charge injection regions 24(1)–24(N) and a corresponding plurality of distinct charge exit regions 25(1)–25(N). The injection and exit regions are constructed from, for example $n^+$ diffusions as described above. The recirculation configuration includes channel dividers or charge splitters 40, 42 disposed in the vicinity of the charge exit and injection regions, respectively. The channel dividers are configured as inactive regions which correspond to regions within the p-type substrate which are not provided with active diffusions. The channel dividers serve to slice up or divide the charge packet into discrete sub-packets 31(1)–31(N) in order to hold and maintain the incremental change in packet lateral redistribution.

The sub-packets are provided to the charge exit regions 25 and then passed on to a plurality of charge recirculation conductors 44(1)–44(N). Each charge exit region is connected to its corresponding charge injection region by a recirculation conductor. The recirculation conductors are constructed from an overlying metal II layer of the device with a metal I layer serving as a electrostatic shield between the recirculation conductors and the gate electrodes. The recirculation conductors 44 accommodate recycling the sub-packets back to the charge injection regions 24 for injection between dividers 42 so as to recreate the charge packet which was initially divided into sub-packets by dividers 40 at the charge exit regions. The dividers 42 prevent carrier redistribution in the sub-packets prior to the recreated packet being once again propagated across the gate electrodes. The thus recreated charge packet allows for a continuation of the redistribution of charge carriers.

The recirculation of the sub-packets serves to provide a more sensitive and accurate resultant potential reading in a relatively short array of gate electrodes. Otherwise, the device would have to be configured as an extensively long array of gate electrodes in order to achieve full lateral redistribution of charge carriers in the propagating charge packets. In addition, the recirculation accommodates an increase in operational frequency, and a reduction of several orders of magnitude of total required gate drive power for a given sensitivity.

The charge transfer magnetic field sensor 20 in accordance with the present invention operates in a manner similar to a generator complete with armature and commutator. In other words, when a wire moves through a magnetic field B with a velocity v which is not parallel with B, a potential difference $V_i$ is induced between the ends of the wire. There are two different ways of calculating $V_i$, while assuming that the wire, its direction of motion, and the flux density B are all perpendicular to one another.

With respect to the forces that act on the electrons able to move freely within the wire, the force on a charge +q when it moves with the velocity v perpendicular to a magnetic field B has the magnitude F=qvB. The direction of this force is along the wire. As the wire moves through the magnetic field, electrons (q=−e) move opposite to the direction shown, so that one end of the wire becomes negatively charged and the other end positively charged. These charges build up until the electric forces they exert on the remaining electrons in the wire are just enough to balance the forces qvB on each of them due to the motion through the magnetic field. When this balance is reached there is no net force on the electrons, and no further charge accumulates at the ends of the wire. If E is the electric field intensity in the wire, the condition for balance is Eq=qvB, thus E=vB. An electric field E acting along the length W of the wire leads to a potential difference of $V_i$=EW, between its ends, and so, substituting vB for E, the result is $V_i$=BWv.

Accordingly, in the charge transfer magnetic field sensor of the present invention, rather than a wire moving in a magnetic field and hence producing a potential along its length, an elongated packet of carriers in silicon is moved. The packet is preceded and followed by a depletion region, thus isolating it from its surroundings. In operation, the sensor is constructed so that one or more charge packets or regions of carriers (holes or electrons), are caused to move rapidly by peristaltic electric fields. The peristaltic electric fields are generated, for example, by applying multiphased clock signals to the gate connections 29 of each of the gate electrodes 28. In an alternative embodiment, the peristaltic electric field is created by the electric field generated by an acoustic wave moving at the surface or in the bulk of substrate including a piezo-electric semiconductor such as gallium arsenide. The carriers in these regions will, in the presence of a magnetic field that is perpendicular to the plane of their motion, experience an electric field that is orthogonal to both the magnetic field and to the direction of their motion, hence generating upon each carrier the well known Lorentz force. The Lorentz force is predicted by Faraday's law of induction and Maxwell's equations. This lateral force is proportional to the product of the magnetic field intensity, the carrier velocity, and the charge of the carrier.

Under the influence of the Lorentz force, the carriers will redistribute laterally within the charge packet until they generate a lateral electric field which is equal to the field creating the Lorentz force. The potential existing between the ends of the charge packet may be sensed as the packet arrives at the charge exit regions and is subsequently recirculated to the charge injection regions. As derived earlier, the voltage sensed at that point is given by $E_{(v_glts)}$=BVW, where B is the magnetic field in Webers/meter$^2$, V is the charge velocity in meters/second, and W is the lateral width of the channel in meters.

When the sensor 20 is exposed to a magnetic field, or to an associated magnetic field induction B directed at a right angle to the surface of the semiconductor substrate 22, each moving charge packet 30 which is being propagated beneath the gate electrodes is exposed to the magnetic field and is thus subjected to the Lorentz force F directed along the longitudinal sense of the charge packets as shown by A. The Lorentz force is directed along the longitudinal sense of the charge packets and is also parallel to the longitudinal direction of the gate electrode. In this case, the equation F=qvB applies, where q is the charge of the charge carriers of the charge packet, e.g. of the electrons.

The Lorentz force produces an increase in charge carriers on one side of the charge packets and a depletion of charge carriers on the other side of the charge packets. This uneven distribution of charge carriers along the oblong charge packets induces an electrical field directed in parallel with the longitudinal sense of the charge packets. The induced electric field, in turn, induces a voltage difference between the two ends of the charge packets which increases as the width of the charge packets and the effective lengths L of the central electrodes increase. Since the effective ends of the charge packet, actually the outermost sub-packets, are at least intermittently in electrical contact with sense contacts 26, the aforementioned voltage difference is equal to the output voltage $V_{out}$ of the magnetic field sensor. In this case, the following equation applies: $V_{out}$=VBW=LfBW. For W=1 mm, L=10 µm, B=1 Tesla and f=100 MHz, $V_{s1,s2}$ can be equal to 1 volt, for example.

It will be appreciated that the sense contacts 26 include a conductive region associated with a selected pair of charge recirculation conductors, preferably the outermost conductors 44(1) and 44(N). Thus, the charge packets will contact the sense contacts as they finish their traverse of the transfer region so as to provide galvanic sensing of the resultant potential.

The output voltage appearing at the sense contacts of the magnetic field sensor thus calculated is proportional to the magnetic field induction B, the effective length W of the central gate electrodes and the velocity of the charge packets. As previously described, the velocity depends only on L and on the pulse frequency of the gate voltages. Furthermore, L and W are exclusively geometrical parameters of the magnetic field sensor. As a result, the output voltage $V_{out}$ of the magnetic field sensor according to the present invention, in contrast to that of a Hall-effect component, is independent of the supply voltage conditions, the mobility of the charge carriers, the carrier concentration and/or environmental conditions.

Figure 6:
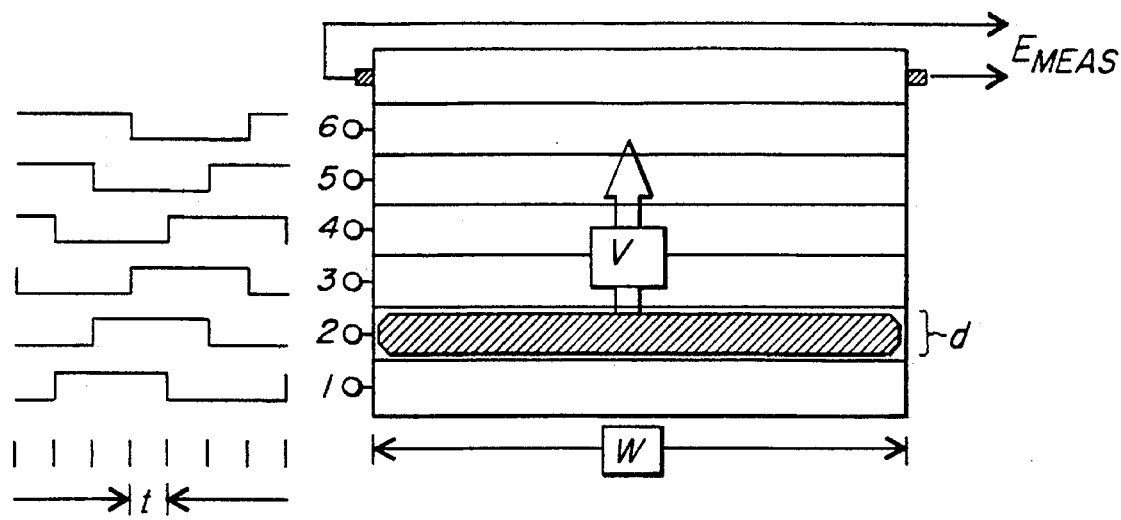
FIG. 6 shows a dimension diagram of the charge-coupled device magnetic sensor of FIG. 2.

The sensitivity of the charge transport magnetic field sensor in accordance with the present invention is readily apparent. With reference to FIG. 6, and as described above, Faraday's law gives rise to the equation $E_{mass}$=$v_o$WB($10^{-4}$), where E is in volts, W is in meters, $v_o$ is the velocity of a charge packet in meters/second, and B is in Gauss ($10^{-4}$ Tesla). Since $v_o$=d/t, where d is the traversing length of each gate electrode and t is a time increment of the clock pulse applied, the resultant $E_{mass}$=$10^{-4}$BWd/t. For example, for d=12 µm long gates, W=1000 µm wide, and t=1.7 ns gate-to-gate delay, the resultant $E_{mass}$=706 µV/Gauss.

Figure 7:
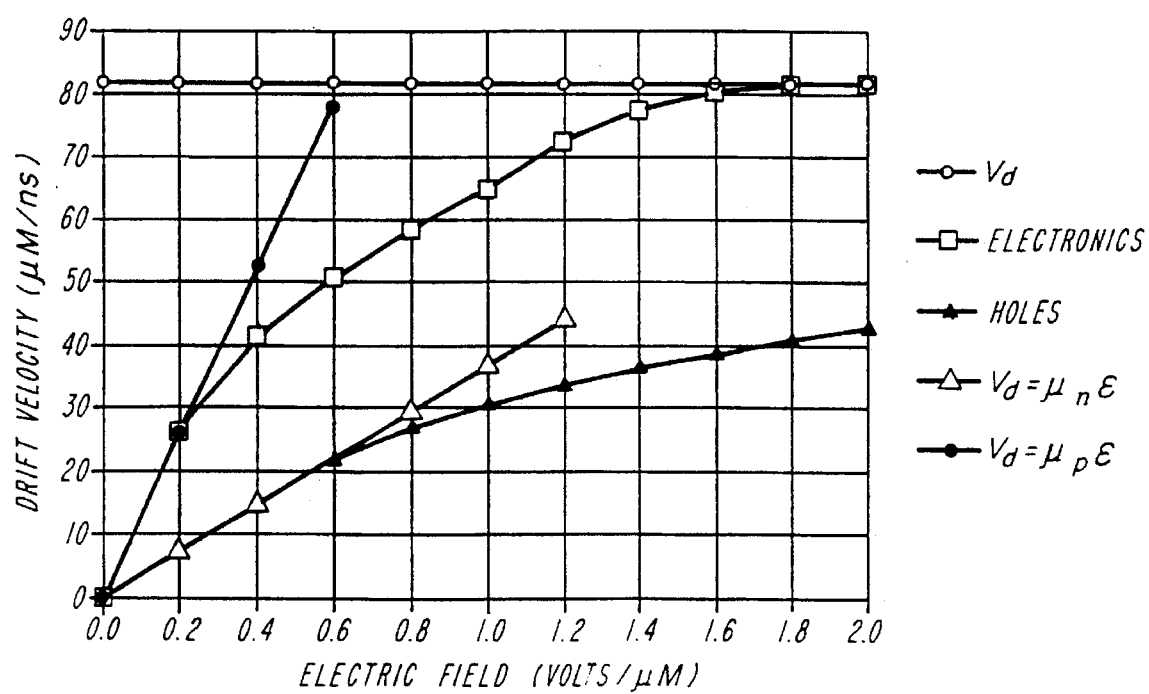
FIG. 7 shows a graph of carrier drift velocity versus electric field magnitude.

There are, however, certain restrictions on the device operation. For instance, the charge packet velocity $v_o$ must not exceed that set by the carrier mobility $\mu_N$. Thus, $V_o < \mu_N V_{gate}/d$. Accordingly, for a given gate spacing d and for an approximate 5 V drive, $v_o = d/t = \mu_N V_{gate}/d$ and $t_{min} = d^2/\mu_N V_{gate}$. Thus, for d=12 μm then $t_{min} = 0.24 \times 10^{-9}$. With reference to FIG. 7, an exemplary graph is shown of the carrier drift velocities versus the electric field.

Figure 8:
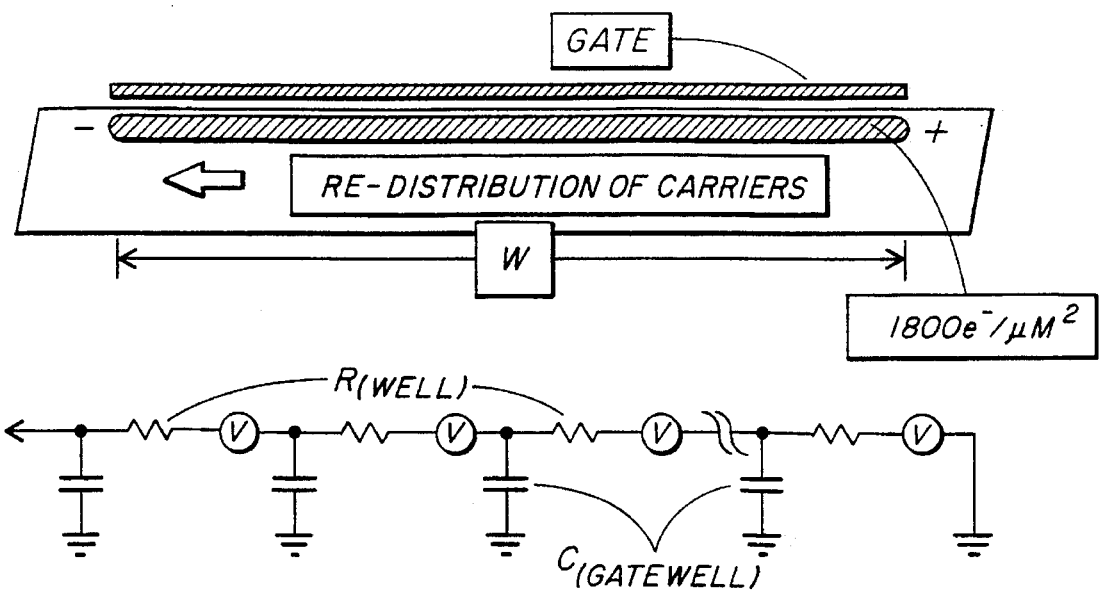
FIG. 8 shows a block diagram of a gate electrode with a charge packet and an equivalent circuit distributed delay line.

With respect to the carrier redistribution, the charge well with the Lorentz force acting on each carrier is similar to an RC distributed delay line, with a distributed generator as illustrated in FIG. 8. It is therefore necessary to calculate the carrier redistribution time constant. For example, in a representative full well $Q_A = 1800 e^-/\mu m^2$ or $0.288 \times 10^{-15}$ Coul/$\mu m^2$, and the gate/well capacity $C_A \approx 0.33 fF/\mu m^2$. Then assume $\mu_N = 0.12 m^2/v$-s, the width of the well equal to $W_{(\mu m)}$, and the "sheet resistance" of the device as $\rho = 1/\mu_N Q_A \approx 29 k\Omega/\square$. Accordingly, the redistribution time constant is found to be $T_{DL} = RC/\pi = W^2 \rho C_A/\pi$, which results in being 3 μs for W=1000 μm. Hence the response frequency to a changing magnetic field, $F_{-3db} = 1/(2\pi T_{DL}) = 1/(2W^2 \rho C_A)$, which results as being 52 kHz for W=1000 μm. For an exemplary 720 μm wide device, $F_{-3db} = 100$ kHz.

Unfortunately, the realistic device dimensions result in insufficient time for the carriers to settle in one transit of the entire sensor. For example, if a charge packet or well transits all of the gate electrodes of the sensor in about 20 ns, and the charge redistribution time constant is 3 μs, then the signal measured after one pass will be only 0.66% of its full value. One solution is to make the sensor 65 mm long just to settle to three Tau (95%) in one pass. A more advantageous solution, and a preferred embodiment of the present invention, is to sample the charge packet's distribution upon its arrival at the charge exit regions, and recirculate the packet back to the charge injection regions in order to allow time to further redistribute the carriers laterally.

Figure 9:
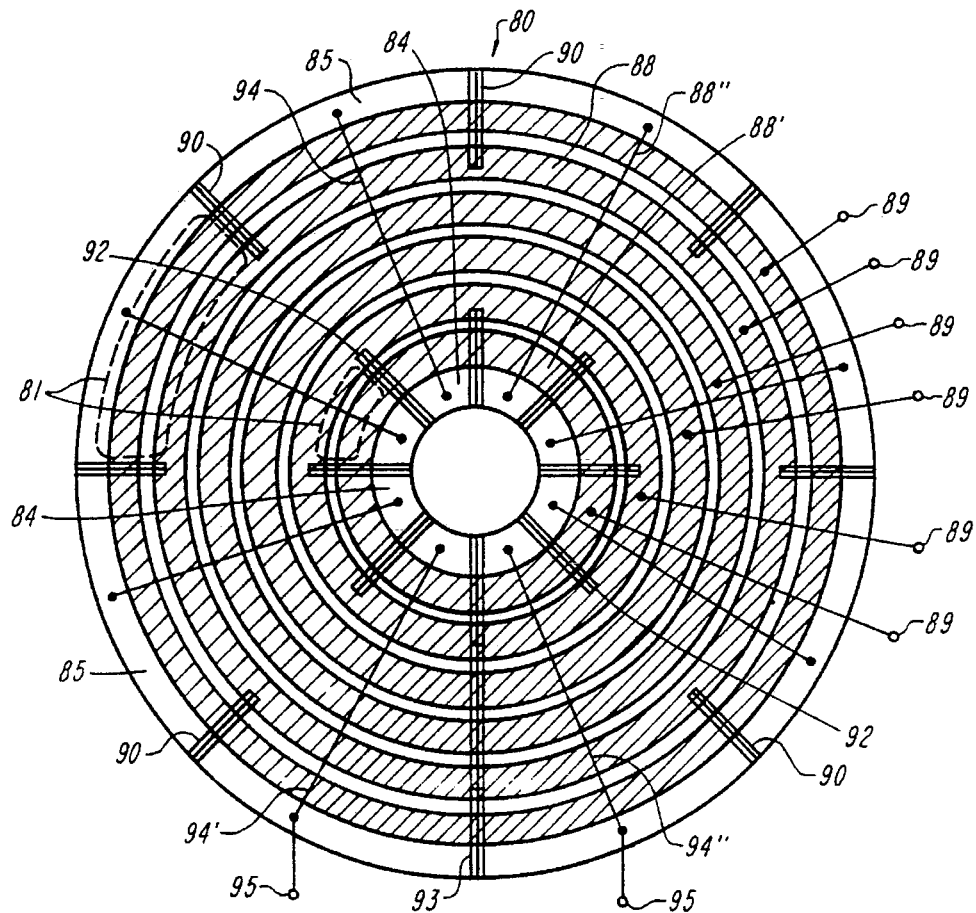
FIG. 9 shows a plan view of a block diagram of an alternative exemplary embodiment of a charge transfer magnetic sensor with concentrically arranged gates in accordance with the present invention.

It will be appreciated by those of skill in the art that while the illustrated exemplary embodiments of the charge transfer magnetic sensor are configured with linear arrays of gate electrodes, other configurations are within the scope of the present invention. For example, it is possible to configure the gate electrodes in a concentric arrangement as shown in the exemplary charge transfer magnetic sensor 80 shown in FIG. 9. In the sensor 80, the charge packets traverse the concentrically arranged gates 88 from an innermost gate 88' having a plurality of distinct charge injection regions 84 to an outermost gate 88" having a corresponding plurality of distinct charge exit regions 85. It is also possible to adapt the magnetic sensor 80 such that the charge packets propagate the gates from the outermost gate towards the innermost gate. In operation, the sensor 80 is constructed so that one or more charge packets or regions of carriers (holes or electrons), are caused to move rapidly by peristaltic electric fields. The peristaltic electric fields are generated, for example, by applying multiphased clock signals to the gate connections 89 of each of the gate electrodes 88.

Each exit region is in turn connected to an associated injection region with a recirculation conductor 94 for recirculating charge sub-packets back to the injection regions. The recirculation configuration includes channel dividers 90, 92 disposed in the vicinity of the charge exit and injection regions, respectively. A channel divider 93 is disposed between the exit and injection regions. The channel dividers serve to slice up or divide the charge packets into discrete sub-packets 81 in order to hold and maintain the incremental change in packet lateral redistribution. The sub-packets are provided to the charge exit regions 85 and then passed on to the plurality of charge recirculation conductors 94. Each charge exit region is connected to its corresponding charge injection region by a recirculation conductor. The recirculation conductors are constructed from an overlying metal II layer of the device as described with reference to the conductors 44 of FIGS. 4 and 5. The configuration of FIG. 9 operates to minimize offset errors due to process gradients in fabrication.

The recirculation conductors 94 accommodate recycling the sub-packets back to the charge injection regions 84 for injection between dividers 92 so as to recreate the charge packet which was initially divided into sub-packets by the dividers 90 at the charge exit regions. The dividers 92 prevent carrier redistribution in the sub-packets prior to the recreated packet being once again propagated across the gate electrodes. The thus recreated charge packet allows for a continuation of the redistribution of charge carriers. The resultant potential differential output is measured between contacts 95 which are in turn connected to conductors 94' and 94".

Figure 10:
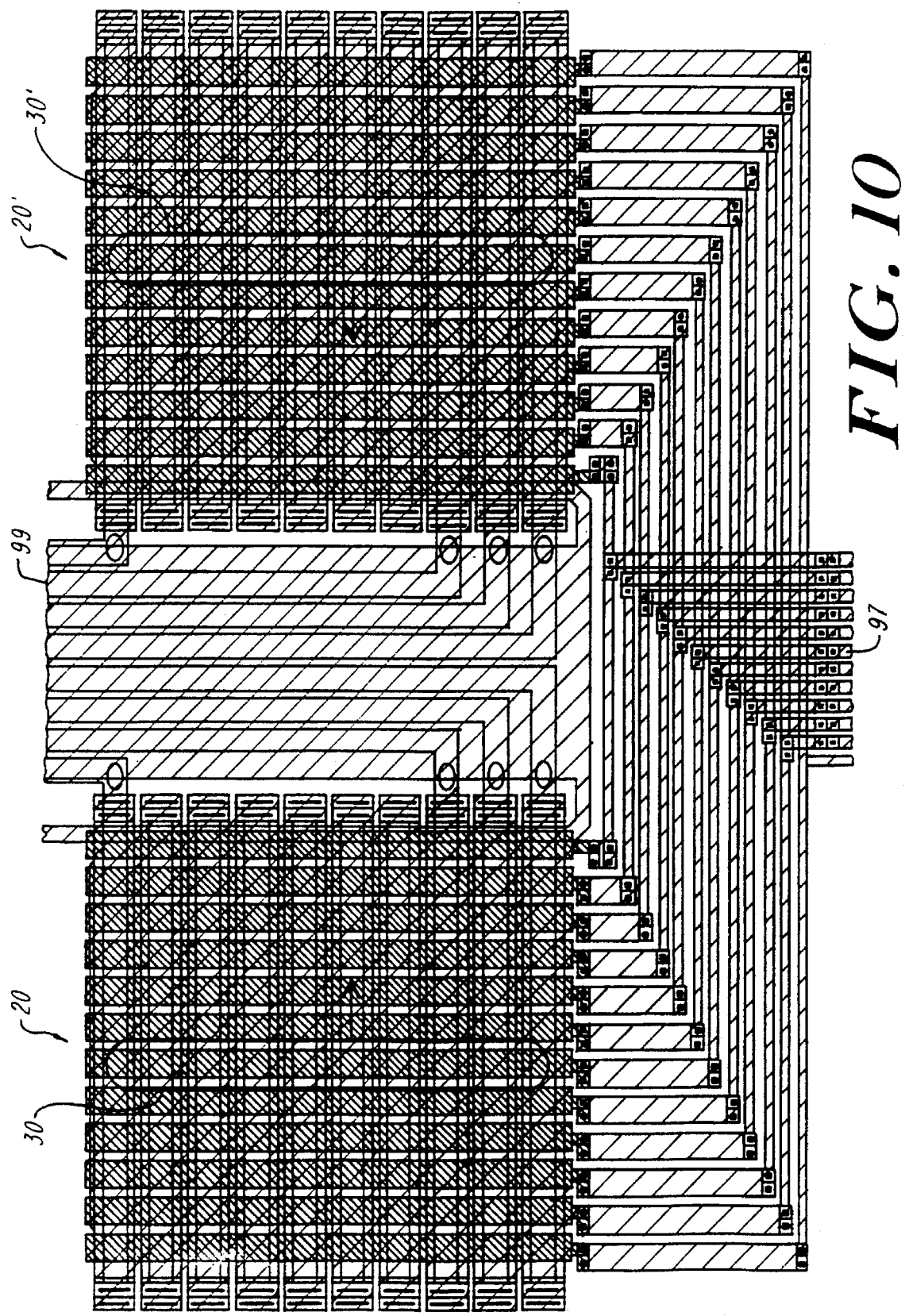
FIG. 10 shows a plan view of a block diagram of an arrangement of two magnetic sensors arranged rotationally 180° with respect to one another in accordance with the present invention.

Another alternative exemplary embodiment of the charge transfer magnetic sensor 20 configured with linear arrays of gate electrodes is shown in FIG. 10. In the arrangement shown, a magnetic sensor 20', which is identical in construction to the sensor 20, is configured to be rotated 180° with respect to the sensor 20. Accordingly, each of the sensors propagates charge packets with the same clocking scheme from input lines 97 in order to obtain a measurement at output lines 99 of a magnetic field in accordance with the resultant potential associated with the redistributed carriers of the charge packets as described heretofore. The results from each of the sensors are compared by an associated processor so as to minimize measurement errors caused by imperfections in the fabrication of the devices and offset errors due to process gradients in fabrication.

The foregoing description has been set forth to illustrate the invention and is not intended to be limiting. Since modifications of the described embodiments incorporating the spirit and substance of the invention may occur to persons skilled in the art, the scope of the invention should be limited solely with reference to the appended claims and equivalents thereof.

What is claimed is:

1. A device for producing an output voltage which is proportional to an applied magnetic field, said device comprising:

a charge injection region;

a charge exit region;

a charge transfer region;

means for propagating at least one isolated charge packet across said charge transfer region in a predetermined direction from said charge injection region to said charge exit region, said charge packet being subject to said applied magnetic field which is perpendicular to said charge transfer region so as to induce a resultant potential that is orthogonal to both said applied magnetic field and said predetermined direction, said resultant potential effecting a lateral redistribution of charge carriers in said packet;

means for recirculating said packet from said output region back to said input region in order to accommodate a continuation of said redistribution of charge carriers; and means for sensing said resultant potential as said output voltage.

2. The device of claim 1, wherein said propagating means comprises a peristaltic electric field.

3. The device of claim 2, wherein said charge transfer region comprises a series array of gates configured on a dielectric layer disposed on a semiconductor substrate, said gates being adapted to create potential wells beneath said dielectric layer which effect charge storage and transfer.

4. The device of claim 3, wherein said charge transfer region comprises a linear series array of gates.

5. The device of claim 3, wherein said charge transfer region comprises a concentric series array of gates.

6. The device of claim 3, wherein said array of gates comprises a charge transfer device.

7. The device of claim 6, wherein said charge transfer device comprises a surface or buried channel charge-coupled device.

8. The device of claim 3, wherein said propagating means comprises a clocked signal sequentially applied to each of said gates so as to define said peristaltic electric field beneath said gates.

9. The device of claim 6, wherein said propagating means isolates said charge packet during propagation from preceding and subsequent charge packets.

10. The device of claim 1, wherein said recirculation means comprises a plurality of channel dividers for dividing said charge packet into a plurality of sub-packets at said charge exit region.

11. The device of claim 10, wherein said recirculation means further comprises respective recirculation paths associated with each sub-packet for accommodating recirculation of said sub-packets back to said charge injection region.

12. The device of claim 11, wherein said sensing means is operable for galvanically sensing said resultant potential between a predetermined pair of said recirculation paths.

13. The device of claim 12, wherein said sensing means comprises conductive regions associated with each of said predetermined pair of recirculation paths which respective sub-packets contact during recirculation from said charge exit region to said charge injection region.

14. The device of claim 2, wherein said charge transfer region is configured in a piezo-electric semiconductor substrate.

15. The device of claim 14, wherein said peristaltic electric field is generated by an acoustic wave propagating on the surface of said piezo-electric semiconductor substrate.

16. The device of claim 1 further comprising:

a second charge transfer region;

second propagating means for propagating a second isolated charge packet across said second charge transfer region in a predetermined second direction, said second charge packet being subject to said applied magnetic field which is perpendicular to said second charge transfer region so as to induce a second resultant potential that is orthogonal to both said applied magnetic field and said predetermined second direction; and second means for sensing said second resultant potential as said output voltage.

17. The device of claim 1, wherein said resultant potential is a function of said applied magnetic field, the velocity of said charge packet propagating said charge transfer region, and the width of said charge transfer region.

18. A magnetic sensing device which generates an output signal proportional to an applied magnetic field, said device comprising:

a semiconductor substrate;

means for propagating an isolated charge packet across a selected portion of said substrate in a predetermined direction from an input region to an output region in response to an applied peristaltic electric field, said charge packet being responsive to said applied magnetic field which is perpendicular to said predetermined direction to induce a resultant potential that is orthogonal to said predetermined direction and said applied magnetic field, said resultant potential effecting a redistribution of charge carriers in said packet;

means for recirculating said packet from said output region back to said input region in order to accommodate a continuation of said redistribution of charge carriers; and potential sensing regions associated with said means for recirculating across which said resultant potential is sensed as said output signal.

19. A device for producing an output voltage which is proportional to an applied magnetic field, said device comprising:

a plurality of charge injection regions and a corresponding plurality of charge exit regions;

a plurality of charge storage regions arranged in an array between said charge injection and exit regions;

means for propagating an isolated charge packet along said array of storage regions in a predetermined direction, said charge packet being subject to said applied magnetic field which is perpendicular to said array so as to induce a resultant potential that is orthogonal to both said applied magnetic field and said predetermined direction, said resultant potential effecting a lateral redistribution of charge carriers in said packet;

means for recirculating said packet from said output region back to said input region in order to accommodate a continuation of said lateral redistribution of charge carriers; and means for sensing said resultant potential as said output voltage.

20. The device of claim 19, wherein said propagating means comprises a peristaltic electric field.

21. The device of claim 20, wherein said array of charge storage regions comprises a series array of gates configured on a dielectric layer disposed on a semiconductor substrate, said gates being adapted to create potential wells beneath said dielectric layer which effect charge storage and transfer.

22. The device of claim 21, wherein said array of charge storage regions comprises a linear series array of gates.

23. The device of claim 21, wherein said array of charge storage regions comprises a concentric series array of gates.

24. The device of claim 21, wherein said array of charge storage regions comprises a charge transfer device.

25. The device of claim 24, wherein said charge transfer device comprises a surface or buried channel charge-coupled device.

26. The device of claim 21, wherein said propagating means comprises a clocked signal sequentially applied to each of said gates so as to define said peristaltic electric field beneath said gates.

27. The device of claim 21, wherein said propagating means isolates said charge packet during propagation from preceding and subsequent charge packets.

28. The device of claim 21, wherein said recirculation means comprises a plurality of channel dividers for dividing said charge packet into a plurality of sub-packets at said charge exit regions.

29. The device of claim 19, wherein said recirculation means further comprises respective recirculation paths associated with each sub-packet for accommodating recycling of said sub-packets back to said input charge region.

30. The device of claim 29, wherein said sensing means is operable for galvanically sensing said resultant potential between a predetermined pair of said recirculation paths.

31. The device of claim 30, wherein said sensing means comprises conductive regions associated with each of said pair of recirculation paths which respective sub-packets will contact during recirculation from said charge exit regions to said charge injection regions.

32. The device of claim 19, wherein said array of storage regions are configured in a piezo-electric semiconductor substrate.

33. The device of claim 32, wherein said peristaltic electric field is generated by an acoustic wave propagating on the surface of said piezo-electric semiconductor substrate.

34. The device of claim 19 further comprising:

a second array of storage regions;

second propagating means for propagating a second isolated charge packet along said second array of storage regions in a predetermined second direction, said second charge packet being subject to said applied magnetic field which is perpendicular to said second array so as to induce a second resultant potential that is orthogonal to both said applied magnetic field and said predetermined second direction; and second means for sensing said second resultant potential as said output voltage.

35. The device of claim 19, wherein said resultant potential is a function of said applied magnetic field, the velocity of said charge packet propagating said array of storage regions, and the width of said storage regions.

36. A method for producing an output voltage which is proportional to an applied magnetic field, said method comprising the steps of:

transferring a charge packet along an array of storage regions in a predetermined direction from an input region to an output region, said charge packet being subject to said applied magnetic field which is perpendicular to said array so as to induce a resultant potential that is orthogonal to both said applied magnetic field and said predetermined direction, said resultant potential effecting a lateral redistribution of charge carriers in said charge packet;

recirculating said packet from said output region back to said input region in order to accommodate a continuation of said redistribution of charge carriers; and sensing said resultant potential as said output voltage.

37. A magnetic sensing device which generates an output signal proportional to an applied magnetic field, said device comprising:

a semiconductor substrate;

a plurality of isolated charge packets which traverse a selected portion of said substrate in a predetermined direction from an input region to an output region in response to an applied peristaltic electric field, said charge packets being responsive to said applied magnetic field which is perpendicular to said predetermined direction to induce a resultant potential that is orthogonal to said predetermined direction and said applied magnetic field, said resultant potential effecting a lateral redistribution of charge carriers in said charge packet;

means for recirculating said packet from said output region back to said input region in order to accommodate a continuation of said lateral redistribution of charge carriers; and potential sensing regions associated with said recirculating means across which said resultant potential is sensed as said output signal.

38. A device for producing an output voltage which is proportional to an applied magnetic field, said device comprising:

a plurality of charge storage regions arranged in an array including an input region and an output region;

means for propagating a plurality of isolated charge packets along said array of storage regions in a predetermined direction, said charge packets being subject to said applied magnetic field which is perpendicular to said array so as to induce a resultant potential that is orthogonal to both said applied magnetic field and said predetermined direction, said resultant potential effecting a lateral redistribution of charge carriers in said charge packet;

means for recirculating said packet from said output region back to said input region in order to accommodate a continuation of said lateral redistribution of charge carriers; and means for sensing said resultant potential as said output voltage.

* * * * *